United States Patent
Evans et al.

(10) Patent No.: US 10,222,202 B2
(45) Date of Patent: Mar. 5, 2019

(54) THREE DIMENSIONAL STRUCTURE FABRICATION CONTROL USING NOVEL PROCESSING SYSTEM

(71) Applicant: Varian Semiconductor Equipment Associates, Inc., Gloucester, MA (US)

(72) Inventors: Morgan D. Evans, Manchester, MA (US); Simon Ruffell, South Hamilton, MA (US); Tristan Y. Ma, Lexington, MA (US); Kevin Anglin, Somerville, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/605,869

(22) Filed: May 25, 2017

(65) Prior Publication Data

US 2018/0340769 A1 Nov. 29, 2018

(51) Int. Cl.
*G03F 7/20* (2006.01)
*G01B 11/24* (2006.01)

(52) U.S. Cl.
CPC .......... *G01B 11/24* (2013.01); *G03F 7/70591* (2013.01)

(58) Field of Classification Search
None
See application file for complete search history.

(56) References Cited

U.S. PATENT DOCUMENTS

| | | | | |
|---|---|---|---|---|
| 7,035,696 | B1* | 4/2006 | Sadeghi | G05B 17/02 156/345.1 |
| 2006/0186406 | A1* | 8/2006 | Bushman | G01N 21/4738 257/48 |
| 2015/0346605 | A1* | 12/2015 | Den Boef | G03F 7/705 438/401 |
| 2017/0025252 | A1* | 1/2017 | Liang | H01J 37/3053 |

* cited by examiner

*Primary Examiner* — Shawn Decenzo (57) ABSTRACT

An apparatus may include a processor and memory unit, including a control routine having a measurement processor to determine, based upon a first set of scatterometry measurements, a first change in a first dimension of a first set of substrate features along a first direction. The first set of substrate features may be elongated along a second direction perpendicular to the first direction. The measurement processor may be to determine, based upon a second set of scatterometry measurements, a second change in dimension of a second set of substrate features along the second direction, wherein the second set of substrate features is elongated along the first direction. The apparatus may include a control processor to generate an error signal when a figure of merit based upon the first change and the second change lies outside a target range.

16 Claims, 6 Drawing Sheets

THREE DIMENSIONAL STRUCTURE FABRICATION CONTROL USING NOVEL PROCESSING SYSTEM

FIELD

The present embodiments relate to processing apparatus and methods, and more particularly, to apparatus and methods to facilitate control of structure fabrication on substrates.

BACKGROUND

In the integrated circuit (IC) industry, known lithography methods (e.g., 193 nm excimer laser, pattern quadrupling, and extreme ultraviolet (EUV)) are reaching limits in the ability to pattern complicated IC features. This limit is due to the nature of the device structures, especially the smallest size or critical dimension (CD) of features, which dimension has been reduced with each technology generation for fabricating memory or logic devices, including complementary metal oxide semiconductor (CMOS) devices. For example, in some present day technologies, devices are defined by critical dimensions less than 100 nm, and in some cases less than 25 nm. Often the device or structure to be fabricated may be repeating structures such as linear structures (lines), where processing may involve changing the size (dimension) along one direction, such as the X-direction, or Y-direction, but not along both directions. Furthermore, in some instances a change in vertical direction (Z-direction) is to be minimized during processing. Therefore, improved control of X, Y, and Z dimensions for various structures including complicated structure shapes is useful, where control to less than 5 nm variation may be useful.

In addition to controlling of individual dimensions of devices along select directions, statistical process control may be useful to ensure repeatability of device dimensions across multiple different microscopic or nanoscopic devices, where such devices are distributed over a surface of a substrate over macroscopic distances, such as many centimeters.

To this end, Critical Dimension Scanning Electron Microscopy (CD-SEM) has be developed to evaluate and control device processing. Notably, the use of CD-SEM is relatively slow and expensive, requiring a wafer (substrate) to be transported from a processing apparatus being evaluated to a remote area of a fabricator. This transfer and evaluation entails reduced throughput, affecting cost of development of processing, as well as cost of manufacturing once a process has been implemented. Furthermore, measurement of the height of a line or other structure along the Z-direction, entails breaking a substrate.

It is with respect to these and other considerations the present embodiments are provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus for control of structure fabrication on a substrate may include a processor and a memory unit coupled to the processor, where the memory unit including a control routine, the control routine operative on the processor to manage processing of the substrate. The control routine may include a measurement processor to determine, based upon a first set of scatterometry measurements, a first change in a first dimension of a first set of substrate features along a first direction. The first set of substrate features may be elongated along a second direction perpendicular to the first direction. The measurement processor may determine, based upon a second set of scatterometry measurements, a second change in dimension of a second set of substrate features along the second direction. The second set of substrate features may be elongated along the first direction. The control routine may further include a control processor to generate an error signal when a figure of merit based upon the first change and the second change lies outside a target range.

In a further embodiment, a method may include performing a first set of scatterometry measurements on a first set of substrate features disposed on a substrate, the first set of substrate features being spaced along a first direction and elongated along a second direction, perpendicular to the first direction. The method may further include performing a second set of scatterometry measurements on a second set of substrate features disposed on the substrate, the second set of substrate features being spaced along the second direction and elongated along the first direction. The method may also include determining, based upon the first set of scatterometry measurements, a first change in a dimension of the first set of substrate features along the first direction. The method may also include determining, based upon the second set of scatterometry measurements, a second change in a dimension of the second set of substrate features along the second direction. The method may further include generating an error signal when a figure of merit based upon the first change and the second change lies outside a target range.

In a further embodiment, a processing system may include a processing apparatus to perform a process operation on a substrate. The processing system may include a scatterometer coupled to the processing apparatus, the scatterometer to perform a first set of scatterometry measurements and a second set of scatterometery measurements on the substrate. The processing system may also include a processor; and a memory unit coupled to the processor and including a control routine. The control routine may be operative on the processor to manage processing of the substrate. The control routine may include a measurement processor to determine, based upon the first set of scatterometry measurements, a first change in a first dimension of a first set of substrate features along a first direction, after the process operation. The first set of substrate features may be disposed on the substrate, wherein the first set of substrate features is elongated along a second direction perpendicular to the first direction. The measurement processor may determine, based upon the second set of scatterometry measurements, after the process operation, a second change in dimension of a second set of substrate features along the second direction. The second set of substrate features may be also disposed on the substrate, wherein the second set of substrate features is elongated along the first direction. The control routine may also include a control processor to generate an error signal when a figure of merit based upon the first change and the second change lies outside a target range.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein relate to systems, apparatus and techniques providing improved control of fabrication of structures such as devices or other features on a substrate, such as a semiconductor wafer. While not limited to any particular dimension, the present embodiments may be especially useful for control of fabrication of structures having at least one dimension less than several micrometers, and in some instances less than one hundred nanometers. Various embodiments employ a control arrangement including a novel combination of processing apparatus, scatterometer and grating structure to monitor and adjust fabrication of three dimensional structures on a substrate.

Figure 1A:
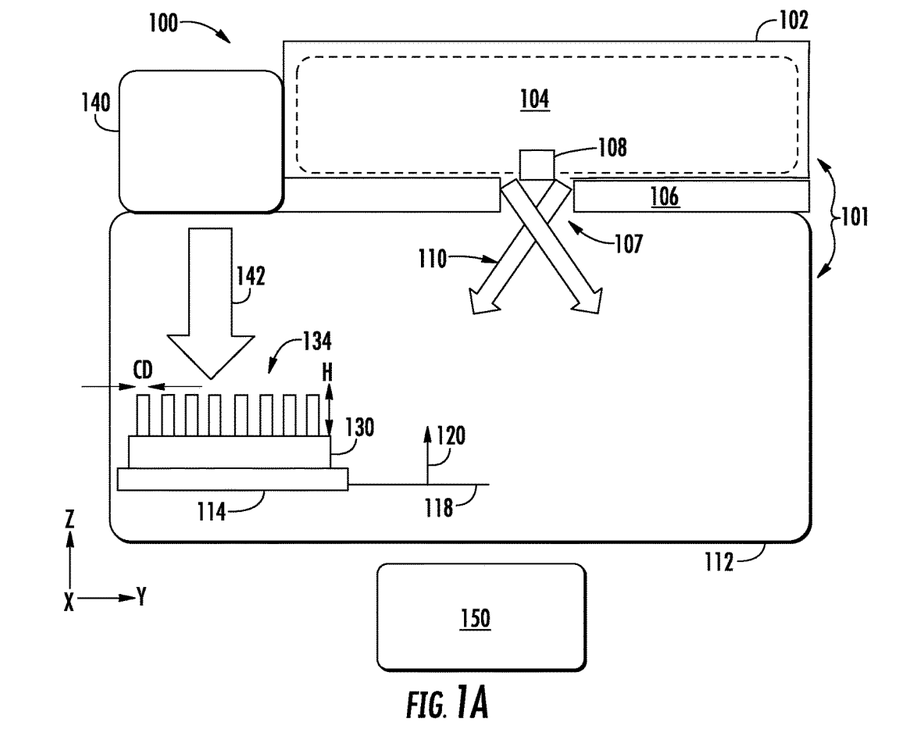
FIG. 1A illustrates a processing apparatus consistent with various embodiments of the disclosure.

FIG. 1A depicts a processing system 100 according to various embodiments of the disclosure. The processing system 100 includes a processing apparatus 101, as well as scatterometer 140, where the scatterometer 140 may be located adjacent the processing apparatus 101, may be coupled to the processing apparatus 101 via another component, such as a loadlock, or may be incorporated into the processing apparatus, in different embodiments. In other embodiments the scatterometer 140 may be located remotely from the processing apparatus 101. In various embodiments, the processing apparatus 101 may be a tool to perform etching of a substrate, to deposit a coating on a substrate, to implant into a substrate, to polish a substrate, or to perform a combination of operations, such as etching and deposition operations. The embodiments are not limited in this context.

As suggested in FIG. 1A, in particular embodiments the processing apparatus 101 may include components to direct a process beam(s) 110 to a substrate 130 in order to etch the substrate 130 or deposit a layer of material such as a coating on the substrate 130. The processing apparatus 101 may be a plasma-based apparatus, including any known component to generate a plasma 104 in a plasma chamber 102. The processing apparatus 101 may include, for instance, an extraction plate 106, adjacent the plasma chamber 102, and a process chamber 112, adjacent the extraction plate 106, where the extraction plate 106 extracts the process beam 110 via extraction aperture 107. The process beam 110 may be a directional ion beam or ion beams according to various embodiments. For example, in known extraction plate apparatus, an ion beam may be extracted where an extraction plate defines a plane generally parallel to a substrate plane 118 of the substrate 130, while the ion beam is made of ions having trajectories forming a non-zero angle of incidence with respect to a perpendicular 120 of the substrate plane 118. As discussed in more detail with respect to FIG. 2B and FIG. 2C below, this geometry allows the process beam 110 to advantageously process selective surfaces or regions of a substrate without processing other surfaces, facilitating the ability to generate device structures not otherwise able to be fabricated. In the embodiment of FIG. 1A, a beam blocker 108 is disposed in the plasma chamber 102, so as to generate two process beams, so the process beam 110 may represent a pair of process beams. The pair of process beams may define ion trajectories forming a mirror image of one another about the X-Z plane of the Cartesian coordinate system shown. In other embodiments the beam blocker 108 may be omitted, resulting in just one process beam being extracted from the plasma chamber 102.

As further depicted in FIG. 1A the processing system 100 may expose the substrate 130 to a light beam 142, generated by the scatterometer 140. As detailed below, the light beam 142 may be used to probe structures disposed on the surface of substrate 130, to determine the effect of etching or deposition generated by processing apparatus 101 on devices of structures on substrate 130. In various embodiments, the substrate 130 may be advantageously provided with a test structure 134, where the test structure 134 includes a plurality of gratings, as discussed below. In brief, the test structure 134 may provide gratings arranged in a manner to allow measurements to be readily performed by scatterometer 140, where such measurements simulate aspects of device features for devices located on substrate 130. In particular, the measurements performed on test structure 134 may provide information concerning device processing where such information is not readily accessible or is inconveniently obtained by directly measuring the devices in question.

In some embodiments, the substrate 130 may be movable within the processing system 100 from a process position to a measurement position. For example, the substrate 130 may be movable wherein the substrate 130 remains under vacuum between measurement by scatterometer 140 and processing by processing apparatus 101. As further shown in FIG. 1A as well as FIG. 1B, the processing system 100 may include a control apparatus 150 including a processor 152, such as a known type of microprocessor, dedicated processor chip, general purpose processor chip, or similar device. The control apparatus 150 may further include a memory unit 154, coupled to the processor 152, where the memory unit 154 contains a control routine 156. The control routine 156 may be operative on the processor 152 to manage processing of the substrate 130 as described below. The memory unit 154 may comprise an article of manufacture. In one embodiment, the memory unit 154 may comprise any non-transitory computer readable medium or machine readable medium, such as an optical, magnetic or semiconductor storage. The storage medium may store various types of computer executable instructions to implement one or more of logic flows described herein. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

Figure 1B:
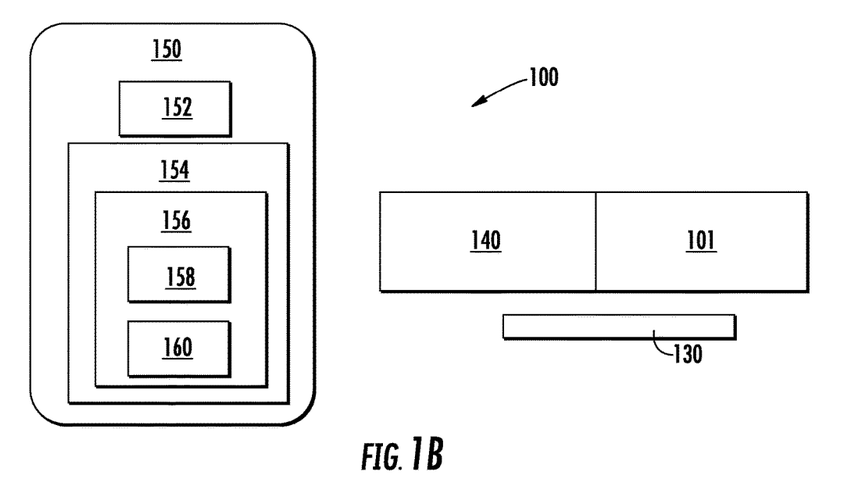
FIG. 1B depicts a block diagram of the processing apparatus of FIG. 1A.

In particular embodiments the control routine 156 may include a measurement processor 158 and control processor 160. The measurement processor 158 may determine various changes in structures on the substrate 130 when the substrate 130 is subject to processing by the processing apparatus 101, based upon measurements performed by the scatterometer 140. The measurement processor 158 may in particular aid in process control for the processing apparatus 101 by determining device or other structure changes based upon scatterometry measurements performed on the test structure 134.

Figure 2A:
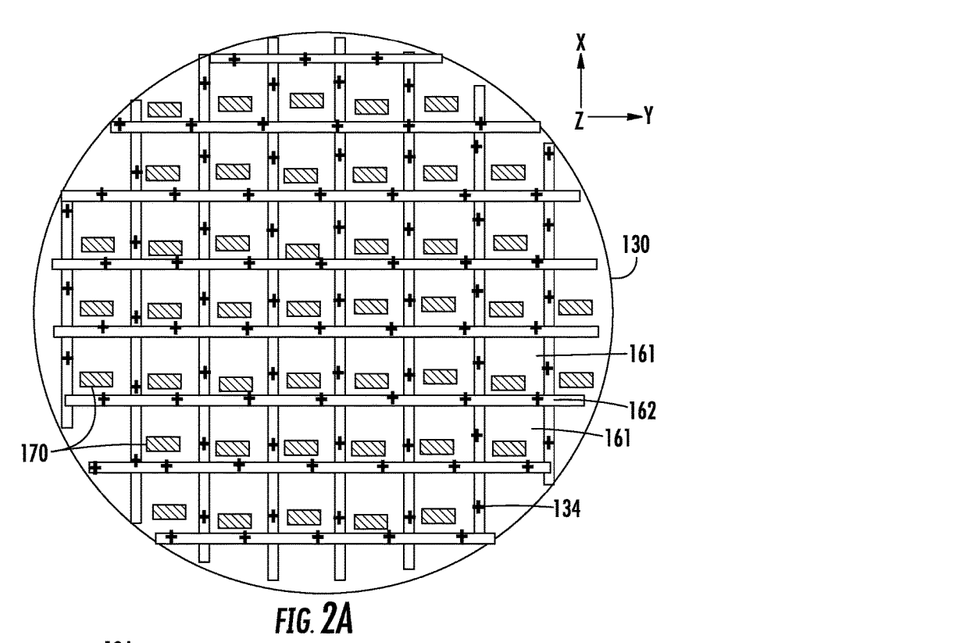
FIG. 2A depicts a plan view of an exemplary substrate arrangement according to embodiments of the disclosure.
Figure 2B:
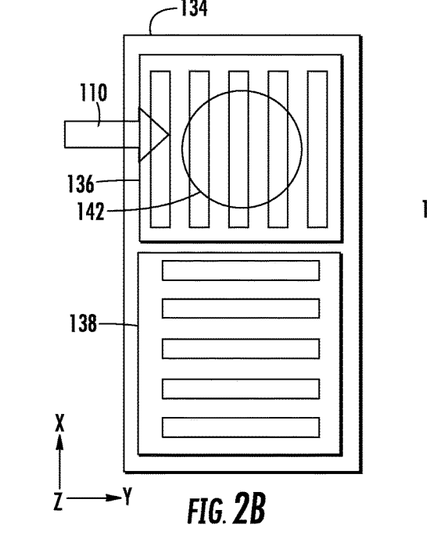
FIG. 2B depicts a plan view showing details of an exemplary test structure, included in the substrate arrangement of FIG. 2A.
Figure 2C:
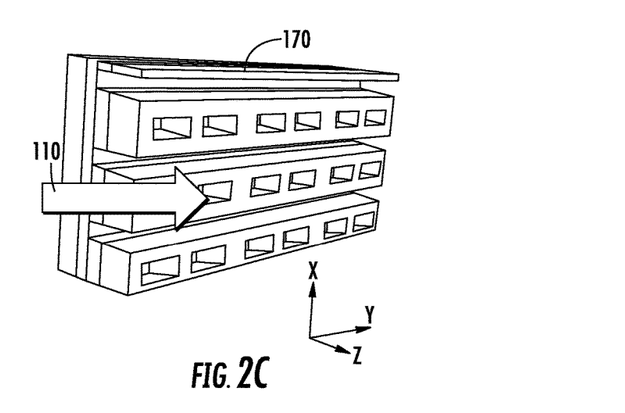
FIG. 2C depicts details of an exemplary device structure, included in the substrate arrangement of FIG. 2A.

Turning now to FIG. 2A, FIG. 2B, and FIG. 2C, there are shown details of a test arrangement according to embodiments of the disclosure. In FIG. 2A there is shown a plan view of an embodiment of the substrate 130, where the substrate 130 may be a semiconductor wafer, such as a silicon wafer. The substrate 130 may include a plurality of semiconductor die, shown as chips 161, where the chips 161 are separated by border regions 162, as in known configurations for wafer processing. In some embodiments, the test structure 134 may be located in border regions 162, as represented by the crosses. In other embodiments, the test structure 134 may be included within a chip 161. According to various embodiments, the test structure 134 may be sized so as to fit within a border region 162, where the width of a border region may be a few millimeters or less.

As shown in FIG. 2B, the test structure 134 may include a first grating 136, having a first array of lines, where the first array of lines is defined by a first pitch along a first direction (Y-axis). The test structure 134 may further include a second grating 138 having a second array of lines, where the second array of lines is defined by a second pitch along a second direction (X-axis). In some cases the first pitch and the second pitch may be the same. As shown in FIG. 2B the first grating 136 may be composed of substrate features elongated along the second direction, perpendicular to the first direction, while the second grating 138 is composed of a second set of substrate features elongated along the first direction.

The first grating 136 and the second grating 138 may be sized so as to fully accommodate the light beam 142, as shown in FIG. 2B. For example, the light beam 142 may have a diameter on the order of 10 micrometers to 50 micrometers as in known scatterometry apparatus. The embodiments are not limited in this context. At the same time the first grating 136 and the second grating 138 may be rectangles or squares having a dimension along the various sides of at least greater than the diameter of the light beam 142. In one example the diameter of the light beam 142 may be 15 micrometers while the diameter of the width of a (square shaped) embodiment of the first grating 136 and second grating 138 may be 50 micrometers.

During a series of measurements performed by the scatterometer 140, the light beam 142 may be positioned to perform a first set of scatterometry measurements over first grating 136 and a second set of scatterometry measurements over second grating 138. For example, the first set of scatterometry measurements may comprise a first scatterometry measurement and a second scatterometry measurement, performed on the first grating 136, before and after processing by the processing apparatus 101, respectively. Additionally, the second set of scatterometry measurements may comprise a third scatterometry measurement and a fourth scatterometry measurement, performed on the second grating 138, before and after processing by the processing apparatus 101, respectively.

The measurement processor 158 may use these measurements to determine changes in the test structure 134, where the changes may be used in various manners. For example, the changes in the test structure 134 may be used to collect data to correlate the effect of process conditions to microscopic changes on structures such as device structures in substrate 130. In accordance with various embodiments, the scatterometer 140 may be used to probe changes in structures having a dimension to be probed less than one micrometer. For example, known scatterometers are particularly useful to measure structures having dimensions on the order of 100 nm or less. Accordingly, the width of the features of the first grating 136 and second grating 138, along the shorter dimension, may be on the order of 100 nm or less, and in some examples 20 nm or less. Similarly, the spacing between adjacent substrate features within the first grating 136 or second grating 138 may be on the order of 100 nm or less.

In one particular example where the process beam 110 is an etching ion beam, etching may take place according to sputtering, reactive ion beam etching, or other known etch process. In these circumstances, the measurement processor 158 may determine etch rates of structures within the first grating 136 and second grating 138 along different directions, based upon the first set of scatterometry measurements and the second set of scatterometry measurements. In accordance with some embodiments, the relative etch rate along the Y-axis (of the Cartesian coordinate system shown) as compared to etch rate along the X-axis may be determined by evaluation of the first set of scatterometry measurements and second set of scatterometry measurements.

In detail, the measurement processor 158 may process results of a first scatterometry measurement, where the first scatterometry measurement is performed on a first set of substrate features of the test structure 134, such as lines of first grating 136, before a treatment by the processing apparatus 101. The measurement processor 158 may further process a second scatterometry measurement, where the second scatterometry measurement is performed on the lines of grating after treatment by the processing apparatus 101. Additionally, the measurement processor 158 may process results of a third scatterometry measurement, where the third scatterometry measurement is performed on a second set of substrate features, such as lines of the second grating 138, before the treatment is performed by the processing apparatus. Additionally, the measurement processor 158 may process results of a fourth scatterometry measurement, where the fourth scatterometry measurement is performed on the lines of the second grating 138, after the treatment is performed by the processing apparatus.

As a result of processing of the scatterometry measurements performed on the test structure 134, the relative changes in dimensions of various features of another structure, such as a complex 3 dimensional device structure in chip 161, may be determined. Turning now to FIG. 2C, there is shown a device structure 170, where the device structure 170 may have a complex structure as shown, not easily measurable, particularly in a non-destructive manner. For example, the device structure 170 may include a two dimensional array of trenches extending in a third dimension (Z-axis), as shown. A goal may be to process the device structure 170 in a manner changing the dimension of device structure 170 in a precise and selective manner. For example, in modern processing apparatus, selective processing of a substrate is possible wherein etching is directed along one direction (such as along the Y-axis), in preference over etching along another perpendicular direction (such as along the X-axis). In particular, the processing apparatus 101 may be capable of delivering a process beam 110 where the trajectory of ions in the process beam lies parallel to the Y-axis as shown in FIG. 2B and FIG. 2C, while at the same time forming a non-zero angle of incidence with respect to the perpendicular 120, as shown in FIG. 1A. This geometry of a process beam allows the process beam 110 to strike surfaces such as vertical surfaces oriented along the X-Z plane, for example, while not striking surfaces oriented along the Y-Z plane. In this manner, trenches of the device structure 170 may be selectively elongated by etching along the Y-axis using process beam 110, while not being elongated along the X-axis.

In order to determine this selective etching, the measurement processor 158 may process the various sets of scatterometry measurements performed on the test structure 134 as described above, where the first grating 136 and second grating 138 may serve as proxies for device features of device structure 170. In other words, the first grating 136 may provide information generally related to changes in device features of device structure 170 along the Y direction, while the second grating 138 may provide information generally related to changes in device features of device structure 170 along the X direction.

In accordance with embodiments of the disclosure, the measurement processor 158 may additionally employ the aforementioned scatterometry measurements to determine changes in device dimensions along a third direction, meaning along the Z-axis of the Cartesian coordinate system shown. In known scatterometry apparatus, when a light beam is directed to a structure such as a grating structure, three dimensional information may be generated based upon analysis of light reflected from the grating structure. Accordingly, based upon a first set of scatterometry measurements and second set of scatterometry measurements, performed on the first grating 136 and second grating 138, respectively, the measurement processor 158 may determine changes along a third dimension, in this case, the Z-axis. In other words, based upon the first set of scatterometry measurements, performed on the first grating 136, a third change in dimension of substrate features of the first grating 136 may be determined along the Z-axis. Additionally, based upon the second set of scatterometry measurements, performed on the second grating 138, a fourth change in dimension of substrate features of the second grating 138 may also be determined along the Z-axis.

Figure 3:
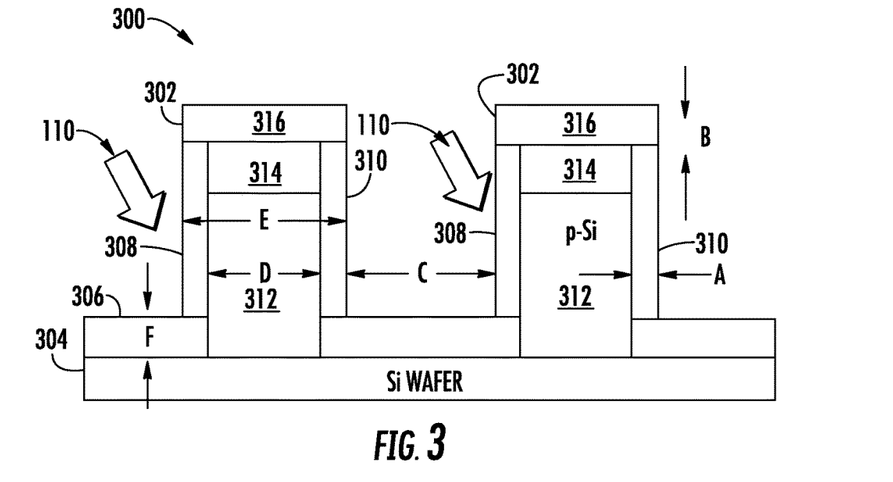
FIG. 3 depicts a cross-section of an exemplary test structure.

Turning now to FIG. 3, there is shown a test structure 300 illustrating various components of a device structure. The different components may be probed and analyzed by the processing system 100 according to embodiments of the disclosure. As shown, the test structure 300 includes a plurality of test features 302, disposed on a substrate 304. As illustrated, the test structure 300 may further include a first layer 306, disposed adjacent to the substrate 304, a first sidewall 308, second sidewall 310, inner structure 312, first cap layer 314, disposed on a top of inner structure 312, and second cap layer 316, disposed on first cap layer 314. Each of these structures may be composed of a different material. For example, the substrate 304 may be monocrystalline silicon, the first layer 306 may be first type of silicon nitride, the first cap layer 314 may be a second type of silicon nitride, the second cap layer 316 may be a third type of silicon nitride, and the inner structure may be polysilicon. Additionally, the first sidewall 308 and second sidewall 310 may be a different material, such as silicon oxide. According to embodiments of the disclosure, the measurement processor 158 may determine dimensions, as well as changes in dimensions of the various features by processing scatterometry measurements in accordance with known principles. For example, an inter-structure spacing C may be determined, a structure width E may be determined, a sidewall thickness A may be determined, a second cap layer thickness B may be determined, a layer thickness F may be determined, as well as an inner structure width D.

In accordance with embodiments of the disclosure, a test structure, such as test structure 300, may be constructed using a similar set of materials as used in a device structure of a substrate to be modeled. In other words, referring again to FIG. 2C, a device structure 170 may include a two dimensional array of trenches formed in an oxide layer, where the oxide layer is disposed on a silicon substrate. In this example, to simulate relevant features of the device structure 170 for the purpose of scatterometry measurements, a test structure having an array of oxide lines disposed directly on silicon may be populated into the first grating 136 and the second grating 138. Said differently, the first grating 136 may include a plurality of north-south (meaning elongated along the X-axis) oxide lines where the spacing between north-south oxide lines mimics the spacing between adjacent trenches of a device structure along the Y-axis. Similarly, the second grating 138 may include a plurality of east-west (meaning elongated along the Y-axis) oxide lines where the spacing between east-west oxide lines mimics the spacing between adjacent trenches of a device structure along the Y-axis. By scatterometry measurement of changes in oxide lines in the first grating 136 and second grating 138, changes in dimensions of oxide trenches of the device structure 170 may be readily simulated or estimated, while not having to perform separate, cumbersome, and destructive measurement of the device structure 170.

The present embodiments may facilitate statistical process control (SPC) for device processing on a substrate by providing a rapid, non-destructive, in-situ, measurement of test structures mimicking devices. In accordance with various embodiments, a test structure 134 may be distributed over a two dimensional grid of locations across a substrate 130, as shown in FIG. 2A, for example, where scatterometry measurements may be performed on dozens, and in some cases hundreds of sites on a given wafer. In other words, at a given period of time, each test structure of a given number of test structures 134 may be measured by a scatterometry measurement performed on the first grating 136 and another scatterometry measurement performed on the second grating 138. Returning to FIG. 1A, a substrate stage 114 may be provided to rapidly move the substrate 130, at least along an X-axis and Y-axis, for example. In this manner, the substrate 130 may be indexed between different sites of the test structures 134 so the light beam 142 lands on the gratings to be measured. In some configurations of the processing system 100, in a production environment, most substrates or all substrates may be measured by scatterometer 140 in this manner without breaking vacuum. In the above manner, across-wafer variation of changes in the test structures 134 due to processing may be rapidly determined, as well as wafer-to-wafer variation in the changes of the test structure. This determination then may directly provide information regarding corresponding across-wafer variation in the change of dimensions of features of complex three-dimensional devices being simulated by the combination of first grating 136 and second grating 138, as discussed above. The same applies to wafer-to-wafer variation in dimensional changes of complex devices.

Figure 4:
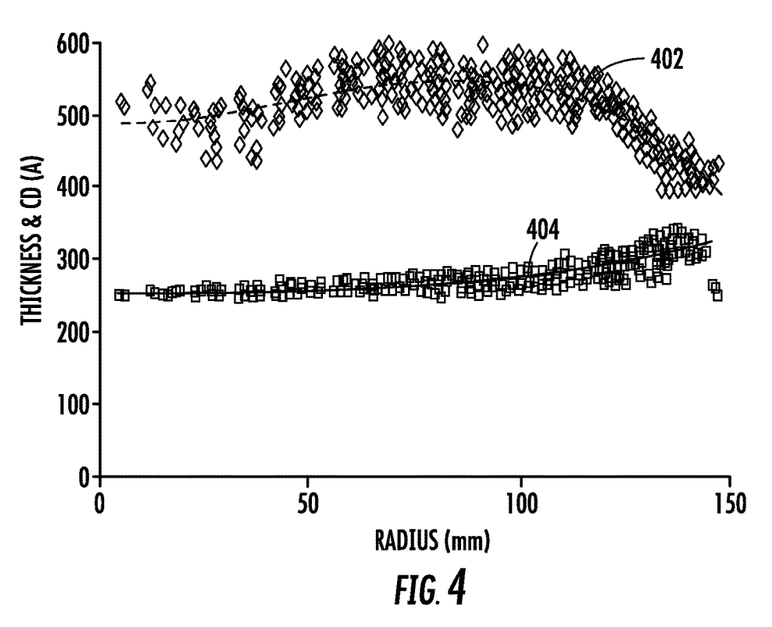
FIG. 4 depicts exemplary scatterometry data as a function of radial position along one radius on a wafer, according to various embodiments of the disclosure.

Turning to FIG. 4 there is shown an example of scatterometry measurement conducted on a series of substrate features located at multiple different locations across a substrate. The curve 402 illustrates the variation of the thickness of a test feature, while the curve 404 illustrates the variation of the width or critical dimension of the test feature, shown as a function of radial position from the center of a substrate.

Notably, at the microscopic level, a given grating may have linewidths and spacings between adjacent lines on the order of hundreds of nanometers, tens of nanometers, or nanometers in some instances. Accordingly, in a given scatterometry measurement conducted with a light beam having a diameter of 20 micrometers, for example, many hundreds or thousands of lines may be sampled in the grating, thus providing a statistical measurement of a given feature of interest at any given test site.

Notably, in some implementations, during treatment of a substrate 130 by a processing apparatus 101, processing information, such as etch rate information, may be extracted from a given grating, such as first grating 136 or second grating 138 by a single measurement of the grating, performed after a process is conducted. In other words, if a priori knowledge of the properties such as dimensions of a grating is available, one scatterometry measurement of the grating, performed after the grating is subject to processing, may be sufficient to determine changes in the grating, such as etch rate.

Figure 5A:
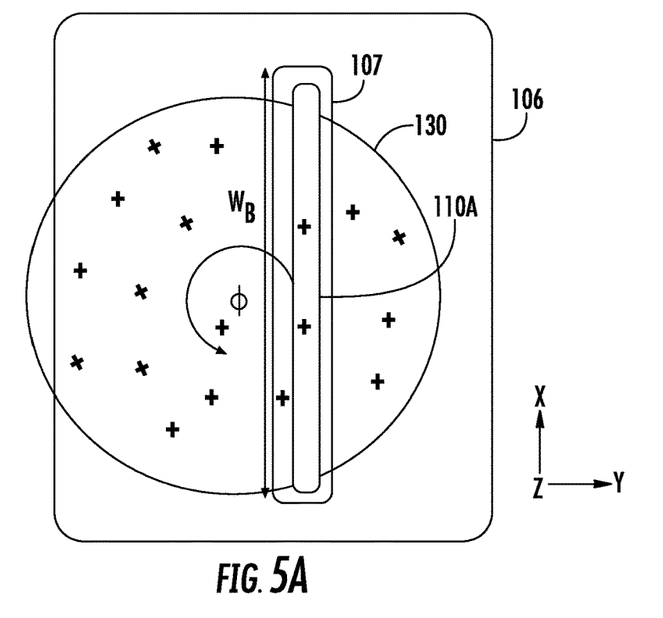
FIG. 5A shows a plan view of an exemplary arrangement of an extraction plate and substrate in accordance with some embodiments of the disclosure.

Turning now to FIG. 5A, there is shown a plan view of an extraction plate 106 and substrate 130 in accordance with some embodiments of the disclosure. In this embodiment, the extraction aperture 107, used to extract the process beam 110A, is elongated along the X-axis, so as to generate a ribbon beam shape to the process beam 110A. In accordance with embodiments of the disclosure, opposite edges of the extraction aperture 107, lying along the X-axis, may be parallel to one another so as to generate a ribbon beam whose cross-section in the X-Y plane has an edge parallel to the X-axis, as shown. Additionally, and with reference to FIG. 5B, the substrate 130 may be rotated about the perpendicular 120 (see FIG. 1A) to a twist angle φ where reference to FIG. 1A, where the long axes of the lines of first grating 136 are aligned along the X-axis and the long axes of the of the lines of second grating 138 are aligned along the Y-axis.

Figure 5B:
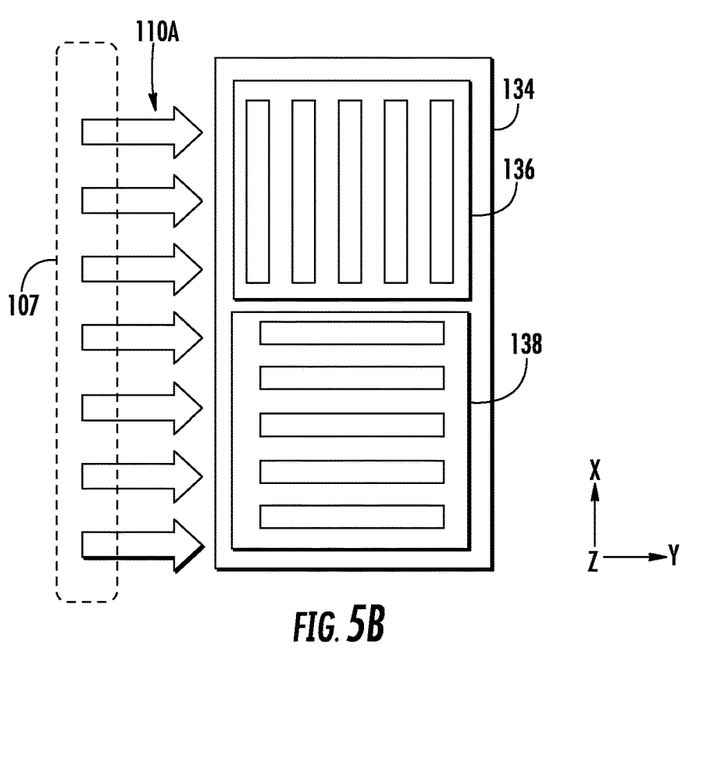
FIG. 5B depicts in plan view details of the geometry of processing a test structure according to embodiments of the disclosure.

As further shown in FIG. 5B, because the long axis of the extraction aperture 107 is parallel to the X-axis, a projection of the trajectories of ions of the process beam 110A may lie parallel to the Y-axis. Notably, as shown for process beam 110 in FIG. 1A the trajectories of ions of process beam 110A may also form a non-zero angle of incidence with respect to the perpendicular 120, and inherently also a non-zero angle of incidence with respect to the substrate plane 118. In this manner, the ions of process beam 110 may selectively strike surfaces oriented in the X-Z plane, while not striking surfaces in the Y-Z plane. In cases where the process beam 110A is an etching beam, using this geometry of ion trajectories as described, the expectation is surfaces of features generally parallel to the X-Z plane will be etched selectively with respect to surfaces of the Y-Z plane. Notably, devices such as device structure 170, may also be aligned where corresponding features to be simulated by the test structure 134 are aligned with the X-axis and the Y-axis. In other words, a device trench having a rectangular cross-section in the X-Y plane may have a first set of trench walls oriented parallel to the X-Z plane and a second set of trench walls oriented parallel to the Y-Z plane.

Thus, when the test structure 134 and extraction aperture 107 are mutually aligned as in FIG. 5B, the expectation is the process beam 110A may etch lines of the first grating 136 wherein a width of the lines along the Y-axis is reduced. At the same time, the width of the lines of the second grating 138 along the X-axis may remain the same. By monitoring changes in the linewidth after subjected to processing by process beam 110A for first grating 136 and second grating 138 as measured by scatterometry, the corresponding changes in more complex device structures such as device structure 170, may be accurately assessed, while not having to measure such device structures. Moreover, because scatterometry is especially sensitive to and accurate for measuring feature dimensions and changes in feature dimensions on the order of nanometers or tens of nanometers, changes in device dimensions of features at the nanometer level may accurately be determined.

Returning to FIG. 1B, as a result of the processing of scatterometry measurements, the control routine 156 may perform different functions. For example, the measurement processor 158 may determine the value of a figure of merit based upon the scatterometry measurements. In one instance the figure of merit may include an etch ratio based on a first etch rate of gratings of the test structure 134 along the X axis and a second etch rate of gratings along the Y axis. In other words, the measurement processor 158 may determine a set of etch rates based upon a first set of scatterometry measurements conducted using the first grating 136 and a second set of scatterometry measurements conducted using the second grating 138. A lateral etch rate along a lateral direction (Y-axis), obtained from the first grating 136, may be compared to a longitudinal etch rate along the longitudinal direction (X-axis), obtained from the second grating 138. The ratio of lateral etch rate to longitudinal etch rate may constitute a figure of merit, or may form a part of a figure of merit.

Once the value of the figure of merit obtained from the scatterometry measurements is determined by the measurement processor 158, the experimental value of the figure of merit may be compared to a target range, such as a target etch ratio range. If the experimental value of the figure of merit lies outside the target range, the control processor 160 may take action, such as to generate a control signal, including in one example, an error signal. The error signal may be sent to other components of the processing system 100, to automatically adjust process parameters of the processing apparatus 101. In other embodiments, the error signal may be displayed to a user to take appropriate action. In various embodiments, if the experimental figure of merit lies within a target range, an OK signal may be generated by the control processor 160 to indicate processing conducted by the processing apparatus 101 may continue without adjustment.

Figure 6:
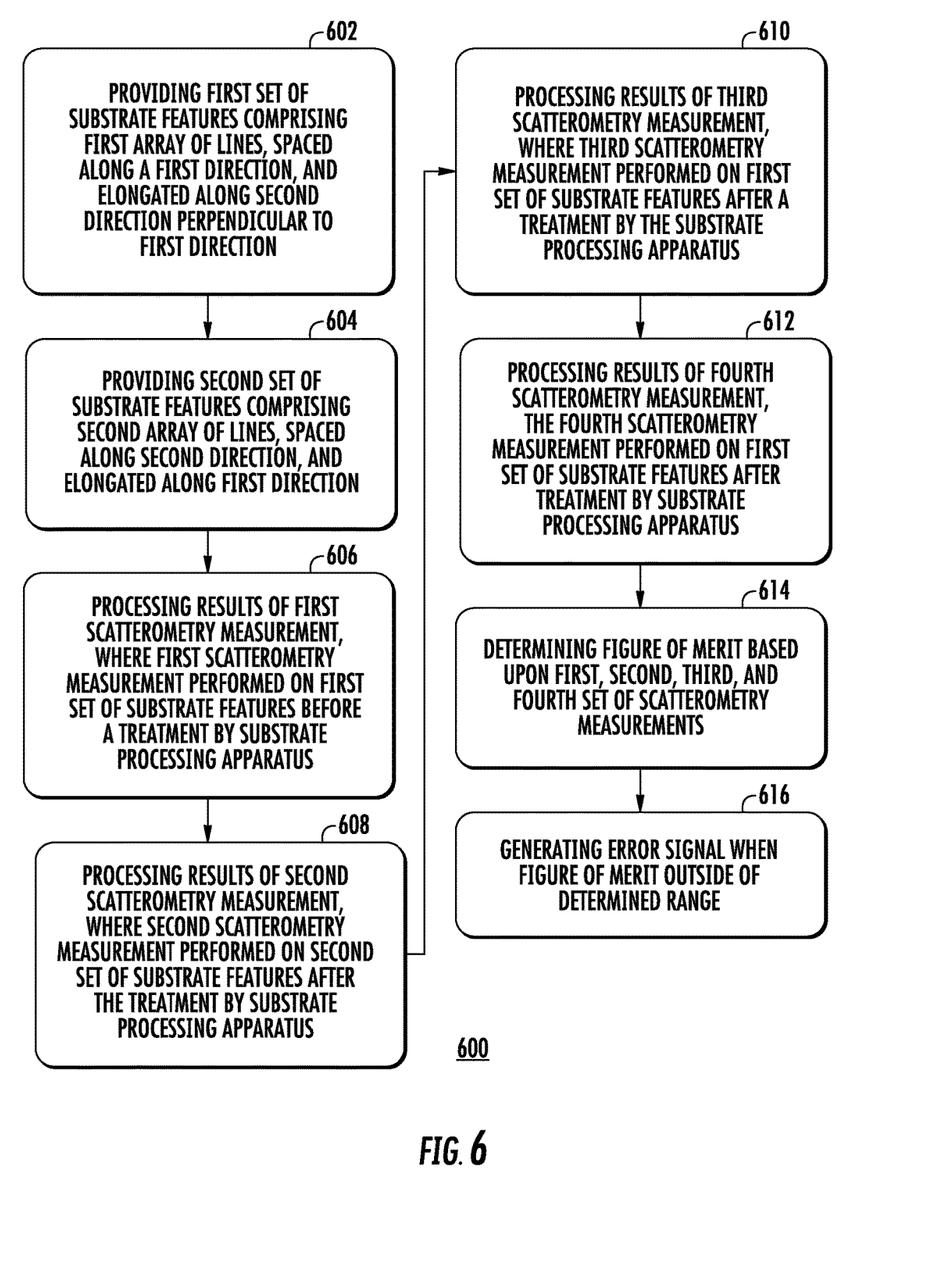
FIG. 6 depicts an exemplary process flow.

Turning now to FIG. 6, there is shown a process flow 600, according to some embodiments of the disclosure. At block 602, the operation is performed of providing a first set of substrate features comprising a first array of lines, spaced along a first direction, and elongated along second direction perpendicular to the first direction. This array of lines may be a grating arranged generally based upon known "SEM bar" structures in some embodiments. The first array of lines may form a first part of a test structure where the width of lines, spacing of lines, height of lines, material of lines, and so forth, is designed according to preset criteria.

At block 604, the operation is performed of providing a second set of substrate features comprising a second array of lines, which lines, in contrast to the first array of lines, are spaced along the second direction, and elongated along the first direction. The second array of lines may form another part of the test structure including the first array of lines.

At block 606, the operation is performed of processing results of a first scatterometry measurement, where the first scatterometry measurement is performed on the first set of substrate features before a treatment by a substrate processing apparatus.

At block 608 the operation is performed of processing results of a second scatterometry measurement, where the second scatterometry measurement is performed on the first set of substrate features after the treatment by the substrate processing apparatus.

At block 610 the operation is performed of processing results of a third scatterometry measurement, where the third scatterometry measurement is performed on the second set of substrate features before a treatment by the substrate processing apparatus.

At block 612 the operation is performed of processing results of a fourth scatterometry measurement, the fourth scatterometry measurement being performed on the second set of substrate features after treatment by the substrate processing apparatus.

At block 614, the operation is performed of determining a figure of merit based upon the first, second, third, and fourth set of scatterometry measurements.

At block 616, the operation is performed of generating an error signal when a figure of merit lies outside of a determined range.

Notably, the aforementioned embodiments focus on determination of changes in dimensions of substrate features along the X-axis and the Y-axis, in order to calculate a figure of merit, for example, to determine whether current processing conditions are acceptable. In additional embodiments, changes in dimensions of substrate features along the Z-axis may additionally be incorporated into a determination of whether a process generates etch results falling into an acceptable range.

Figure 7:
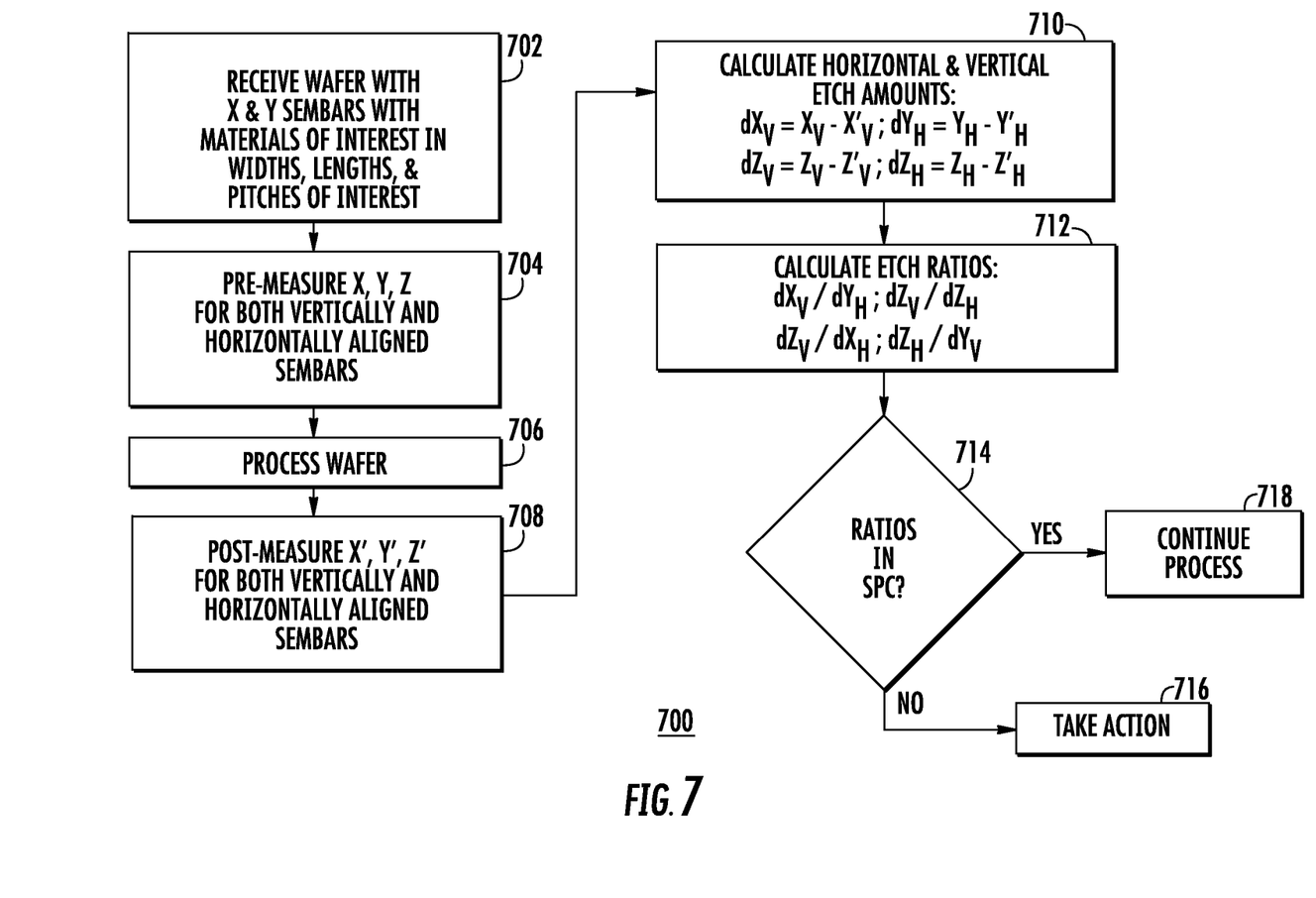
FIG. 7 depicts another exemplary process flow.

Turning now to FIG. 7, there is shown a process flow 700, according to some embodiments of the disclosure. At block 702, a wafer is received having a set of X and Y (horizontal and vertical) SEM bars, which bars may be generally configured as the test structure 134, described hereinabove. The SEM bars may have linewidths, line lengths and pitches, according to predetermined values.

At block 704, dimensions of the horizontally aligned (X SEM bars) and vertically aligned (Y SEM bars) may be premeasured along the X-direction, Y-direction, and Z-direction.

At block 706, processing of the wafer is conducted. In some examples, the processing may take place using a process beam aligned with the SEM bars in a manner generally described with respect to FIGS. 5A and 5B.

At block 708 dimensions of the horizontally aligned (X SEM bars) and vertically aligned (Y SEM bars) may be measured along the X-direction, Y-direction, and Z-direction after the processing.

At block 710, a set of etching amounts may be calculated for the XSEM bars and the YSEM bars. For example, $dX_V$ represents the change in dimension along the X direction for a vertically oriented SEM bar, calculated from measurements before and after processing, or $X_V$-$X'_V$. Similarly, $dY_H$ represents the change in dimension along the Y direction of horizontally oriented SEM bars, calculated from measurements before and after processing, or $Y_H$-$Y'_H$. Additionally, $dZ_V$ represents the change in height or thickness of a vertically aligned SEM bar, determined by measurements before and after processing, or $Z_V$-$Z'_V$. Additionally, $dZ_H$ represents the change in height or thickness of a horizontally aligned SEM bar, determined by measurements before and after processing, or $Z_H$-$Z'_H$.

At block 712, a set of etch rate ratios may be calculated for the XSEM bars and the YSEM bars. For example, the following ratios may be calculated $dX_V/dY_H$, $dZ_V/dZ_H$, $dZ_V/dX_H$, and $dZ_H/dY_V$.

At decision block 714 a determination is made as to whether the ratios as determined at block 714 fall into an acceptable range. The acceptable range may be defined in terms of a statistical process control (SPC), where the SPC may specify a target range for each ratio of the plurality of ratios determined at block 712.

If any ratio falls outside the range, the ratios may be deemed to fall outside the SPC. Alternatively, if the ratios as a collective fall outside a collective range, the ratios may be deemed to fall outside the SPC. In this case, the flow proceeds to block 716, where an error signal is generated to take action. The action may be to halt a process, to adjust a process, or other action. If, at block 714, a determination is made where the etch ratios are deemed to fall within the SPC, the flow proceeds to block 718, where the processing of the wafer or other wafers continues without changes.

An advantage afforded by the present embodiments includes increasing device yield through providing an in-situ measurement approach able to extract process information related to complex device processing on a substrate while not having to measure actual devices on a substrate. An additional advantage afforded by the present embodiments is a straightforward measurement approach to extract device processing information while not destroying devices, reducing cost of development and manufacturing.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:
1. An apparatus for control of structure fabrication on a substrate, comprising:
  a processor; and
  a memory unit coupled to the processor, including a
    control routine, the control routine operative on the processor to manage processing of the substrate, the control routine comprising:
   a measurement processor to determine:
      based upon a first set of scatterometry measurements, a first change in a first dimension of a first set of substrate features along a first direction ($dX_V$), wherein the first set of substrate features is elongated along a second direction perpendicular to the first direction; and
      based upon a second set of scatterometry measurements, a second change in dimension of a second set of substrate features along the second direction ($dY_H$), wherein the second set of substrate features is elongated along the first direction;
      a third change in a third dimension of the first set of substrate features along a third direction, the third direction being perpendicular to the first direction and the second direction, based upon the first set of scatterometry measurements ($dZ_V$); and
      a fourth change in the third dimension of the second set of substrate features along the third direction, based upon the second set of scatterometry measurements ($dZ_H$); and
   a control processor to generate an error signal when a figure of merit lies outside a target range, wherein the figure of merit is based upon a set of ratios including $dX_V/dY_H$, $dZ_V/dZ_H$, $dZ_V/dX_H$, and $dZ_H/dY_V$.

2. The apparatus of claim 1, wherein the first set of scatterometry measurements comprises a first scatterometry measurement and a second scatterometry measurement, wherein the second set of scatterometry measurements comprises a third scatterometry measurement and a fourth scatterometry measurement, the measurement processor to determine the first change by:
   processing results of the first scatterometry measurement, the first scatterometry measurement performed on the first set of substrate features before a treatment by a substrate processing apparatus; and
   processing results of the second scatterometry measurement, the second scatterometry measurement performed on the first set of substrate features after the treatment by the substrate processing apparatus,
   and wherein
   the measurement processor to determine the second change based on the second set of scatterometry measurements by:
   processing results of the third scatterometry measurement, the third scatterometry measurement performed on the second set of substrate features before the treatment is performed on the substrate; and
   processing results of the fourth scatterometry measurement, the fourth scatterometry measurement performed on the second set of substrate features after the treatment is performed on the substrate.

3. The apparatus of claim 2, wherein the treatment comprises etching of the substrate, depositing a layer of material on the substrate, implanting into the substrate, or polishing the substrate.

4. The apparatus of claim 3, the measurement processor to determine a set of etch rates based upon the first set of scatterometry measurements and the second set of scatterometry measurements.

5. The apparatus of claim 4, the set of etch rates comprising a lateral etch rate, along the first direction, and a longitudinal etch rate, along the second direction, the measurement processor to determine an etch rate ratio based upon the lateral etch rate and the longitudinal etch rate, the control processor to generate the error signal when the etch ratio lies outside a target etch ratio range.

6. The apparatus of claim 1, the control processor to send a control signal to adjust a process parameter for treatment of the substrate based upon the error signal.

7. The apparatus of claim 1, wherein the first set of substrate features comprises a first grating having a first array of lines, the first array of lines defined by a first pitch, and wherein the second set of substrate features comprises a second grating having a second array of lines, the second array of lines defined by a second pitch.

8. The apparatus of claim 7, wherein the first change of dimension comprises a change in a first linewidth of the first array of lines of the first grating, and wherein the second change of dimension comprises a change in a second linewidth of the second array of lines of the second grating.

9. A method, comprising:
   performing a first set of scatterometry measurements on a first set of substrate features disposed on a substrate, the first set of substrate features being spaced along a first direction and elongated along a second direction, perpendicular to the first direction;
   performing a second set of scatterometry measurements on a second set of substrate features disposed on the substrate, the second set of substrate features being spaced along the second direction and elongated along the first direction;
   determining, based upon the first set of scatterometry measurements, a first change in a dimension of the first set of substrate features along the first direction ($dX_V$);
   determining, based upon the second set of scatterometry measurements, a second change in a dimension of the second set of substrate features along the second direction ($dY_H$);
   determining a third change in a third dimension of the first set of substrate features along a third direction, the third direction being perpendicular to the first direction and the second direction ($dZ_V$), based upon the first set of scatterometry measurements;
   determining a fourth change in the third dimension of the second set of substrate features along the third direction ($dZ_V$), based upon the second set of scatterometry measurements; and
   generating an error signal when a figure of merit lies outside a target range, wherein the figure of merit is based upon a set of ratios including $dX_V/dY_H$, $dZ_V/dZ_H$, $dZ_V/dX_H$, and $dZ_H/dY_V$.

10. The method of claim 9, wherein the first set of scatterometry measurements comprises a first scatterometry measurement and a second scatterometry measurement, wherein the second set of scatterometry measurements comprises a third scatterometry measurement and a fourth scatterometry measurement, the method comprising:
   determining the first change by:
      processing results of the first scatterometry measurement, the first scatterometry measurement performed on the first set of substrate features before a treatment by a substrate processing apparatus; and
      processing results of the second scatterometry measurement, the second scatterometry measurement performed on the first set of substrate features after the treatment by the substrate processing apparatus;
   and determining the second change by:
      processing results of the third scatterometry measurement, the third scatterometry measurement performed on the second set of substrate features before the treatment is performed on the substrate; and processing results of the fourth scatterometry measurement, the fourth scatterometry measurement performed on the second set of substrate features after the treatment is performed on the substrate.

11. The method of claim 10, wherein the treatment comprises etching of the substrate, the method further comprising: determining a first set of etch rates based upon the first set of scatterometry measurements, and determining a second set of etch rates based upon the second set of scatterometry measurements.

12. The method of claim 11, further comprising determining at least one etch rate ratio based on the first set of etch rates and the second set of etch rates, wherein the figure of merit comprises the at least one etch rate ratio.

13. The apparatus of claim 9, wherein the first set of substrate features comprises a first grating having a first array of lines, the first array of lines defined by a first pitch, and wherein the second set of substrate features comprises a second grating having a second array of lines, the second array of lines defined by a second pitch.

14. The apparatus of claim 13, wherein the first change of dimension comprises a change in a first linewidth of the first array of lines of the first grating, and wherein the second change of dimension comprises a change in a second linewidth of the second array of lines of the second grating.

15. A processing system, comprising:
a processing apparatus to perform a process operation on a substrate;
a scatterometer coupled to the processing apparatus, the scatterometer to perform a first set of scatterometry measurements and a second set of scatterometry measurements on the substrate;
a processor; and
a memory unit coupled to the processor, including a control routine, the control routine operative on the processor to manage processing of the substrate, the control routine comprising:
a measurement processor to determine, based upon the first set of scatterometry measurements, a first change in a first dimension of a first set of substrate features along a first direction ($dX_V$) after the process operation, the first set of substrate features disposed on the substrate,
wherein the first set of substrate features is elongated along a second direction perpendicular to the first direction;
the measurement processor to determine, based upon the second set of scatterometry measurements, after the process operation, a second change in dimension of a second set of substrate features along the second direction ($dY_H$), the second set of substrate features disposed on the substrate, wherein the second set of substrate features is elongated along the first direction;
the measurement processor to determine a third change in a third dimension of the first set of substrate features along a third direction, the third direction being perpendicular to the first direction and the second direction ($dZ_V$), based upon the first set of scatterometry measurements;
the measurement processor to determine a fourth change in the third dimension of the second set of substrate features along the third direction ($dZ_H$), based upon the second set of scatterometry measurements; and
a control processor to generate an error signal when a figure of merit lies outside a target range, wherein the figure of merit is based upon a set of ratios including $dX_V/dY_H$, $dZ_V/dZ_H$, $dZ_V/dX_H$, and $dZ_H/dY_V$.

16. The processing system of claim 15, the processing apparatus comprising:
a plasma chamber;
an extraction plate disposed adjacent the plasma chamber, the extraction plate comprising an extraction aperture; and
a process chamber, disposed adjacent the extraction plate,
wherein the process operation comprises treatment from a process beam directed through the extraction aperture to the process chamber, and
wherein the scatterometer is disposed to measure the substrate after the process operation without breaking vacuum.

* * * * *